US009489475B2

(12) United States Patent
Al-Shaikh et al.

(10) Patent No.: US 9,489,475 B2
(45) Date of Patent: Nov. 8, 2016

(54) RESERVOIR SIMULATION WITH SCALABLE GRID COMPUTING

(71) Applicant: Saudi Arabian Oil Company, Dhahran (SA)

(72) Inventors: Raed Abdullah Al-Shaikh, Dhahran (SA); M Ehtesham Hayder, Dhahran (SA); Majdi A. Baddourah, Dhahran (SA); Omar A. Al-Saadoon, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 0 days.

(21) Appl. No.: 13/875,761

(22) Filed: May 2, 2013

(65) Prior Publication Data

US 2013/0325419 A1 Dec. 5, 2013

Related U.S. Application Data

(60) Provisional application No. 61/653,501, filed on May 31, 2012.

(51) Int. Cl.
*G06F 7/60* (2006.01)
*G06F 17/10* (2006.01)
(Continued)

(52) U.S. Cl.
CPC ......... *G06F 17/5009* (2013.01); *G06F 9/5066* (2013.01); *G01V 1/301* (2013.01); *G06F 2209/501* (2013.01)

(58) Field of Classification Search
CPC .................. G05B 19/4148; G05B 2219/1204; G05B 2219/33104; G05B 17/02; G06F 9/5083; G06F 11/3006; G06F 17/5018; G06F 17/5036; G06F 17/5009; G06F 2217/16

USPC ............................................................. 703/2
See application file for complete search history.

(56) References Cited

U.S. PATENT DOCUMENTS

| 7,526,418 B2 | 4/2009 | Pita et al. |
| 2008/0184042 A1* | 7/2008 | Parks .................. G06F 1/3203 713/300 |

OTHER PUBLICATIONS

Florian Fleissner et al: "Parallel load-balanced simulation for short-range interaction particle methods with hierarchical particle grouping based on orthogonal recursive bisection", International Journal for Numerical Methods in Engineering, vol. 74, No. 4, Apr. 23, 2008 , pp. 531-553, XP55834635.*

(Continued)

*Primary Examiner* — Saif Alhija
(74) *Attorney, Agent, or Firm* — Bracewell LLP; Constance G. Rhebergen; Albert B. Kimball, Jr.

(57) ABSTRACT

Larger, expandable high performance computing (HPC) clusters which are of different generations and performance speeds are provided for reservoir simulation. This provides scalability and flexibility for running computation-intensive reservoir simulation jobs on HPC machines. Availability of larger numbers of processors in a processor pool makes simulation of giant models possible and also reduces fragmentation when multiple jobs are run. A hardware performance based domain decomposition is performed which results in computation load balancing. The reservoir domain is decomposed efficiently to reduce communication overhead. Adaptive detection of the available mix of computation resources is performed, and reservoir simulation decomposition methodology adjusts the distribution of load based on the available hardware and different processor generation resources to minimize the reservoir simulation runtime.

30 Claims, 6 Drawing Sheets

(51) Int. Cl.
G06F 17/50 (2006.01)
G06F 9/50 (2006.01)
G01V 1/30 (2006.01)

(56) References Cited

OTHER PUBLICATIONS

Florian Fleissner et al: "Parallel load-balanced simulation for short-range interaction particle methods with hierarchical particle grouping based on orthogonal recursive bisection", International Journal for Numerical Methods in Engineering, vol. 74, No. 4, Apr. 23, 2008 (2888-84-23), pp. 531-553, XP55834635.*
Foster et al., "The Anatomy of the Grid Enabling Scalable Virtual Organizations", International Journal Supercomputer Applications, 2001, pp. 1-25.
Foster et al., "Grids in Context", The Grid: Blueprint for a New Computing Infrastructure, 2004, pp. 3-12, Elsevier, USA.
Berman et al., "The Grid: past, present, future", Grid Computing Making the Global Infrastructure a Reality, 2003, pp. 9-50, Wiley, Great Britain.
Jacob et al., "Introduction to Grid Computing" IBM Redbooks, Dec. 2005, pp. 1-268, IBM.
Al-Fares et al., "A Scalable, Commodity Data Center Network Architecture", SIGCOMM 08 Aug. 17-22, 2008, pp. 1-12, ACM, Seattle Washington, USA.
Habiballah and Hayder, "Large Scale Parallel Reservoir Simulations on a Linux PC-Cluster", Linux Cluster Institute Conference, 2003, pp. 1-21, QuarterPower Media.
Hayder et al., "Challenges in High Performance Computing for Reservoir Simulation", EAGE Annual Conference & Exhibition Incorporating SPE Eurppec held in Copenhagen, Denmark, Jun. 4-7, 2012, pp. 1-14, SPE 152414, Society of Petroleum Engineers.
Brazell et al., "Multi-core evaluation and performance analysis of the ECLIPSE and INTERSECT Reservoir simulation codes", Oil and Gas High Performance Computing Workshop, Rice University Houston Texas, 2010, pp. 1-33.
Keyes et al., "Domain Decomposition Methods in Science and Engineering", Fourteenth International Conference on Domain Decomposition Methods, Cocoyoc, Mexico, 2003, pp. 79-94, National Autonomous University of Mexico.
Hayder et al., "A Comparison of PETSC Library and HPF Implementations of an Archetypal PDE Computaion", Prepared for Langley Research Center, 1997, pp. 1-23.
Barnard et al., "Large-Scale Distibuted Computational Fluid Dynamics on the Information Power Grid using Globus", The Seventh Symposium on the Frontiers of Massively Parallel Computation, 1999, pp. 1-8.
Shan et al., "Job Superscheduler Architecture and Performance in Computational Grid Environments" Supercomputing 2003, pp. 1-15, Association for Computing Machinery, Phoenix Arizona.
Legrand et al., "Scheduling Distributed Applications: the SimGrid Simulation Framework", 3rd IEEE/ACM International Symposium on Cluster Computing and the Grid (CCGRID 03), May 2003, pp. 1-8, IEEE.
Fleissner et al., "Parallel load-balanced simulation for short-range interaction particle methods with hierarchical particle grouping based on orthogonal recursive bisection", International Journal For Numerical Methods in Engineering, 2008, pp. 531-553, vol. 74, John Wiley & Sons, Ltd.
The International Search Report and Written Opinion for Related PCT Application, PCT/US2013/039826, Jul. 25, 2013.

* cited by examiner

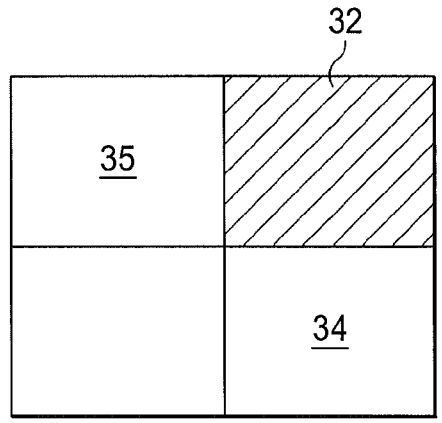 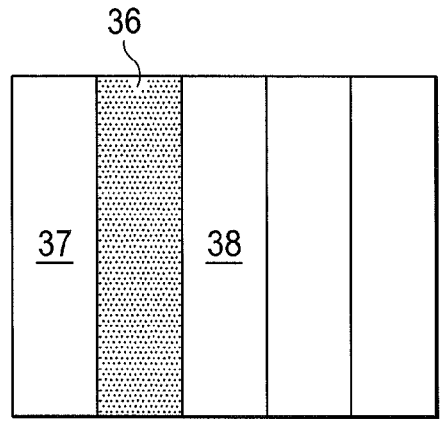
FIG. 3A  FIG. 3B
| PROCESSOR 1: | PROCESSOR 2: |
|---|---|
| HARDWARE PERFORMANCE FACTOR $h_1$ | HARDWARE PERFORMANCE FACTOR $h_1$ |
| NUMBER OF CELL GRID BLOCKS $N_1$ | NUMBER OF CELL GRID BLOCKS $N_1$ |
| PROCESSOR 3: | PROCESSOR 4: |
| HARDWARE PERFORMANCE FACTOR $h_2$ | HARDWARE PERFORMANCE FACTOR $h_2$ |
| NUMBER OF CELL GRID BLOCKS $N_2$, WHERE $R(N_2) = R(N_1) * h_1/h_2$ | NUMBER OF CELL GRID BLOCKS $N_2$, WHERE $R(N_2) = R(N_1) * h_1/h_2$ |
FIG. 4A
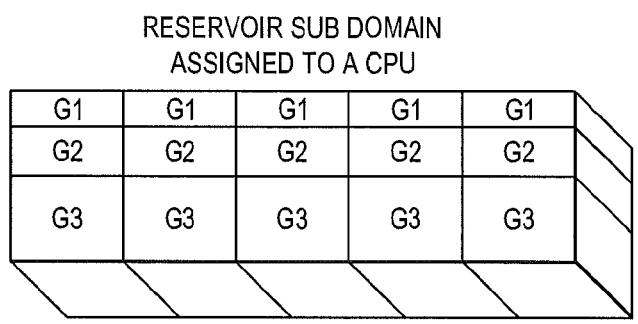
FIG. 4B

RESERVOIR SIMULATION WITH SCALABLE GRID COMPUTING

CROSS REFERENCE TO RELATED APPLICATIONS

This application claims priority from U.S. Provisional Application No. 61/653,501, filed May 31, 2012. For purposes of United States patent practice, this application incorporates the contents of the provisional Application by reference in entirety.

BACKGROUND OF THE INVENTION

1. Field of the Invention

The present invention relates to computerized simulation of hydrocarbon reservoirs in the earth with high performance computing (HPC) clusters, and in particular with scalable and expandable HPC clusters which have sub-clusters of different generations of processors.

2. Description of the Related Art

In the oil and gas industries, massive amounts of data are required to be processed for computerized simulation, modeling and analysis for exploration and production purposes. For example, the development of underground hydrocarbon reservoirs typically includes development and analysis of computer simulation models of the reservoir. These underground hydrocarbon reservoirs are typically complex rock formations which contain both a petroleum fluid mixture and water. The reservoir fluid content usually exists in two or more fluid phases. The petroleum mixture in reservoir fluids is produced by wells drilled into and completed in these rock formations.

A geologically realistic model of the reservoir, and the presence of its fluids, also helps in forecasting the optimal future oil and gas recovery from hydrocarbon reservoirs. Oil and gas companies have come to depend on geological models as an important tool to enhance the ability to exploit a petroleum reserve.

In simulation models, the reservoir is organized into a number of individual cells. Seismic data with increasing accuracy has permitted the cells to be on the order of 25 meters areal (x and y axis) intervals. For what are known as giant reservoirs, the number of cells is the least hundreds of millions, and reservoirs of what is known as giga-cell size (a billion cells or more) are encountered.

One type of computer system which has been available for processing the vast amounts of data of the types encountered in reservoir simulation has been high performance computing (HPC) grids. An HPC grid system takes the form of a group of powerful workstations or servers, joined together as a network to function as one supercomputer.

U.S. Pat. No. 7,526,418, which is owned by the assignee of the present application, relates to a simulator for giant hydrocarbon reservoirs composed of a massive number of cells. The simulator mainly used high performance computers (HPC). Communication between the cluster computers was performed according to conventional, standard methods, such as MPI mentioned above and Open MP.

High Performance Computing (HPC) grids typically have been made available for three years replacement cycles for their computer hardware from the supplying HPC manufacturer. Typically, a new HPC computer system designed for running reservoir simulation has been bought every year either as a replacement for an older system, or as additional growth in compute requirements to run larger models. HPC data centers with such replacement cycles thus typically have at least three generations of computer hardware available for use. These existing systems consume space, power and cooling. They also require maintenance support contracts. It is expected that these systems be utilized efficiently.

Generational differences between these systems have followed Moore's law where the number of transistors, and thus performance, doubled approximately every eighteen months to two years. The difference in performance and speed between first generation and third generation hardware of an installed HPC grid available on the floor is typically on the order of three to four times.

Users tend to demand the newer faster systems (also known as sub-clusters) leaving older ones severely underutilized. These generational sub-clusters are connected together in a grid fashion allowing simulation jobs to straddle multiple sub-clusters. In reality, these sub-clusters are used in a stand-alone fashion because allocation of compute resources across multiple generations of hardware slows down simulation jobs to the slowest hardware in the allocation.

The current mode of running reservoir simulation jobs on the HPC environment is by allocating HPC sub-clusters for the users' runs. These physical clusters cannot be altered once built, due to the physical wiring involved between the compute nodes. Furthermore, the reservoir simulation software assumes equal workload sharing and homogeneous type of CPU's (i.e. same speed) when distributing the load between the compute nodes, otherwise the simulator will perform based on the slowest CPU in the cluster if they are different. This has prevented the running of larger simulation models on grid computers, and also prevented optimal utilization of heterogeneous physical machines when interconnected together.

SUMMARY OF THE INVENTION

Briefly, the present invention provides a new and improved computer implemented method of reservoir simulation in a data processing system. The data processing system is formed of a unified pool of a plurality of processor clusters of processor nodes, at least one of the processor clusters being composed of processor nodes having different processing speeds that the processor nodes in another processor clusters. The computer implemented method allocates available processor nodes from each of the processor clusters in response to a user request for a reservoir simulation, and performs a domain decomposition of reservoir data into blocks for the reservoir simulation. The allocated processor nodes are then assigned to individual ones of the decomposed reservoir data blocks, and the requested reservoir simulation is performed in the allocated processor nodes.

The present invention also provides a new and improved data processing system comprising a unified pool of a plurality of processor clusters of processor nodes, at least one of the processor clusters being composed of processor nodes having different processing speeds that the processor nodes in another processor clusters. The processor nodes in the data processing system allocate available processor nodes from each of the processor clusters in response to a user request for a reservoir simulation, and perform a domain decomposition of reservoir data into blocks for the reservoir simulation. The processor nodes also assign the allocated processor nodes to individual ones of the decomposed reservoir data blocks, and perform the requested reservoir simulation in the allocated processor nodes.

The present invention also provides a new and improved data storage device having stored in a non-transitory computer readable medium computer operable instructions for reservoir simulation in a data processing system, the data processing system comprising a unified pool of a plurality of processor clusters of processor nodes, at least one of the processor clusters being composed of processor nodes having different processing speeds that the processor nodes in another processor clusters. The instructions stored in the data storage device causing the data processing system to allocate available processor nodes from each of the processor clusters in response to a user request for a reservoir simulation and perform a domain decomposition of reservoir data into blocks for the reservoir simulation. The instructions also cause the data processing system to assign the allocated processor nodes to individual ones of the decomposed reservoir data blocks, and performing the requested reservoir simulation in the allocated processor nodes.

BRIEF DESCRIPTION OF THE DRAWINGS

FIG. 3A is a schematic diagram of a domain decomposition strategy for reservoir simulation.

FIG. 3B is a schematic diagram of another domain decomposition strategy for reservoir simulation.

FIG. 4A is a schematic diagram of allocation according to the present invention of reservoir grid blocks between processors in a high performance computing grid based on hardware performance factors.

FIG. 4B is a schematic diagram of allocation according to the present invention of reservoir grid blocks between three generations of processors in a high performance computing grid.

DETAILED DESCRIPTION OF THE PREFERRED EMBODIMENTS

The present invention provides scalable grid computing for reservoir simulation in which the underlying complexity of generational differences in performance in a pool of processor clusters and sub-clusters need not be made available to users. The available pool of processors is presented to users as a unified, larger High Performance Computing (HPC) grid. The user is unaware of the resource allocation taking place when a job is submitted. The present invention uses a new and improved methodology and workflow to select processors from the available pool of mixed resources, and a new and improved domain decomposition strategy to balance load among heterogeneous processors is also provided.

As has been described, current reservoir simulation has, so far as is known, been performed on computer clusters which are homogeneous, built with only one type of processor. Further, the individual clusters are physically separated from, and not interconnected with the other sub-clusters. The current batch system which allocates processors to jobs assigns processors randomly as requested by the user. Different processor generations have in the past been assigned similar amounts of work. Since the clusters are unified, all processors have the same speed. It is thus immaterial which processors are chosen.

Figure 1:
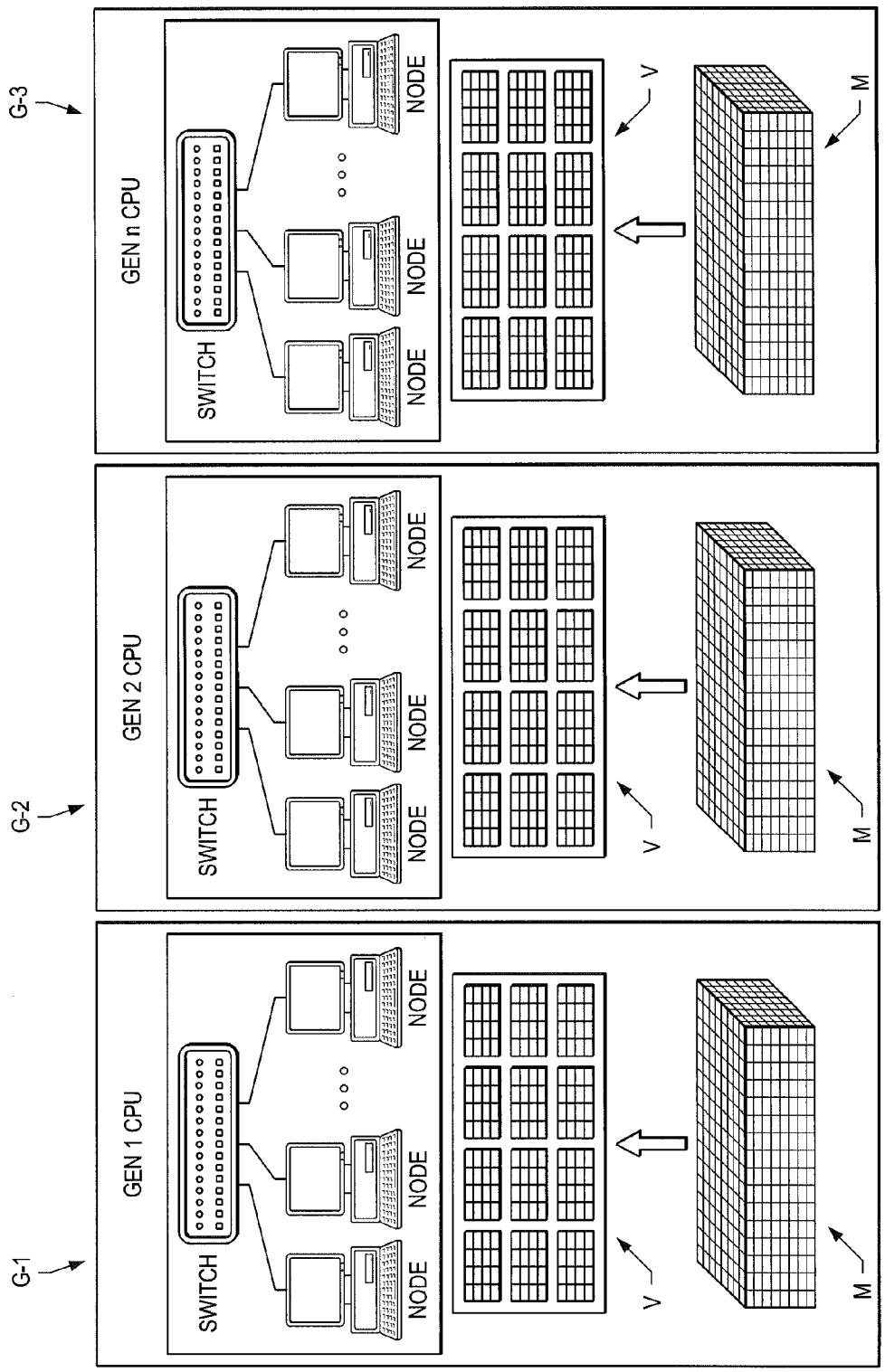
FIG. 1 is a schematic block diagram of a prior art data processing system for high performance grid computing.

FIG. 1 illustrates an example of three generations of CPU's configured according to the prior art. An older generation or first generation (Gen 1 or type 1) CPU cluster is indicated at G-1 in FIG. 1, along with a second or intermediate generation (Gen 2 or type 2) CPU cluster at G-2 and a most recent or newest generation (Gen n or type 3) CPU cluster at G-3. The CPU clusters illustrated in FIG. 1 may, for example, be composed of nodes of an HP Linux cluster computer. As indicated in FIG. 1 and described above, the individual CPU clusters of FIG. 1 are homogeneous and they physically separated from, and not interconnected with teach other.

Figure 5:
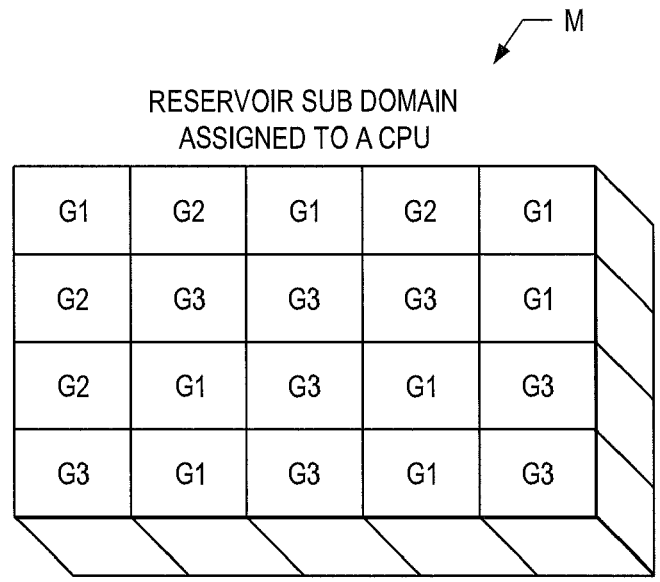
FIG. 5 is a schematic diagram of uniform two dimensional domain decomposition allocation of reservoir grid blocks between three generations of processors in a high performance computing grid.

Furthermore, the two-dimensional domain decomposition strategy of the reservoir model M which is associated in common with the simulation to be run in common by the CPU clusters of FIG. 1 is the same and each of the three CPU clusters. Each CPU cluster was assigned by conventional grid partitioning for processing by the reservoir simulator a like volume V of the reservoir grid which was however different from that assigned others. Thus, the domain decomposition strategy for the homogeneous clusters of FIG. 1 according to the prior art did not allocate an amount of computational task to a processor based on processor performance. Thus, as indicated in FIG. 5, the conventional two-dimensional domain decomposition of a simulation run on a reservoir grid with different processor generations (i.e., Gen 3 as indicated as G3 is faster than Gen 2 indicated as G2 or Gen 1 indicated as G1) yield mixed processors assignments for the reservoir data, in which processors requested by the user were assigned by the batch system randomly to the equally partitioned portions of the computational task. As an example, as shown in FIG. 5, volumes of computational tasks of like size in the reservoir grid were allocated among the three generations of processors G1, G2 and G3.

Figure 2:
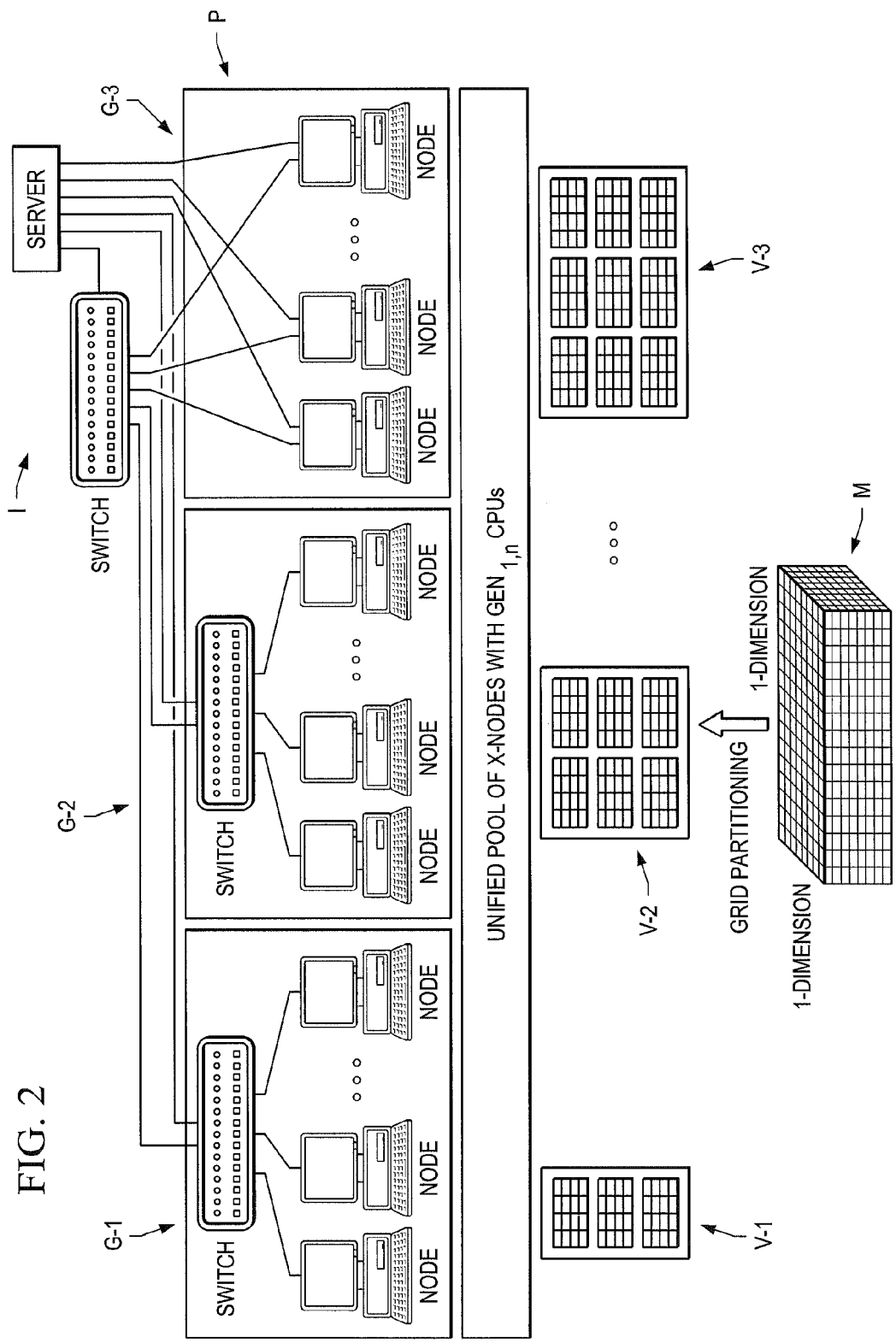
FIG. 2 is a schematic block diagram of a data processing system for high performance grid computing according to the present invention.

With the present invention, as illustrated in FIG. 2, a unified pool P of processor nodes in sub-clusters is formed from the different CPU's. The pool P is thus heterogeneous and a composite computer cluster composed of an older generation or first generation (Gen 1 or type 1) CPU sub-cluster is indicated at G-1 in FIG. 2, along with a second or intermediate generation (Gen 2 or type 2) CPU sub-cluster at G-2 and a most recent or newest generation (Gen n or type 3) CPU sub-cluster at G-3. Although the processor node sub-clusters in the three CPU sub-clusters in the pool P have different performance speeds and characteristics according to their relative age or generation, they are combined according to the present invention into the pool P. Interconnection of the processor nodes is performed by using an Infiniband internetwork I of one or more switches to provide a very large pool of available processors.

However, when these different sub-clusters G-1, G-2 and G-3 are interconnected and combined in the pool P, it has been found conventional prior domain decomposition techniques are no longer efficient or effective. With processors in different sub-clusters working at different speeds but with each sub-cluster, but using conventional grid partitioning as illustrated in FIGS. 1 and 5 according to the prior art, a processing load imbalance was thus caused. Many fast processors are at times idle while waiting for slower processors to finish their work. The overall or composite processing work was only finished when the slowest processor had finished its assigned work.

Accordingly, with the present invention, a new domain decomposition strategy is provided so that the work load assigned on a processor is proportional to its performance. As illustrated in FIG. 2, the slower initial generation processor sub-cluster G-1 is assigned by grid partitioning according to the present invention a smaller workload volume V-1 from the reservoir grid model M that the workload volume V-2 assigned to the intermediate generation processor sub-cluster G-2. The workload volumes V-1 and V-2 are each in turn smaller than the workload volume V-3 assigned to the newer generation processor sub-cluster G-3. The present invention thus permits a good load balance of the computational workload, and thus improved computational efficiency. The present invention uses relative hardware performance of the heterogeneous pool P of processors to select an optimal subset of processors.

The present invention also allocates the computational task (or domain) so that it can be optimally divided among processors. The present invention thus provides better computation load balancing and reduces run time for reservoir simulation. The present invention permits adjustment in the workload assignment or batch system of the number of processors requested by the user, based on the availability and heterogeneity of the pool of processors to optimally run the reservoir simulation job. The present invention provides methodology (FIG. 7) for the batch system to select processors from the available pool, and a companion methodology (FIG. 8) for the domain decomposition to optimally decompose the reservoir simulation model on the selected processors that is passed to the simulator at later stages. (Basically the nodes are allocated from the pool of available nodes in the grid, and then these nodes are assigned weights based on the "relative nodes performance database D. Then, the "domain decomposition" routine (Step 112) runs to optimally find the best distribution based on the selected nodes (step 112 is magnified in FIG. 8)). After optimally finding the best combination of nodes-to-blocks, nodes are formally assigned to blocks in step 114.

The present provides a methodology to build and expand larger HPC clusters for reservoir simulation, to circumvent the shortcomings of the statically built HPC clusters. The present invention provides scalability and flexibility for running such compute-intensive jobs on HPC machines. Availability of larger number of processors in the pool makes simulation of giant models possible, and also reduces fragmentation when multiple jobs are run. The hardware performance based domain decomposition of the present invention results in good load balance and the reservoir domain is decomposed efficiently to reduce communication overhead.

The present invention resolves several limitations compared to the conventional current use of HPC. First, the present invention resolves the problem of clusters' fragmentation, which is caused by the leftover nodes that are kept unutilized when using one sub-cluster, since these unutilized nodes cannot be moved to another sub-cluster due to the physical isolation between clusters. Second, the present invention allows simulating larger models, as opposed to partitioned simulations between sub-clusters. Third, with modifying the simulator, the present invention adapts to the underlying heterogeneous computer grid environment and adjusts its load distribution between nodes based on the different CPU generations (i.e., slower CPU's are assigned fewer tasks during process runtime). Fourth, the submission script provides a mechanism to make a good selection of the pool of processors for simulation. The submission script can easily adapt any needed change. Hardware performance weighted domain decomposition according to the present invention gives a good load balance in computational load among processors.

The present invention provides a dynamic environment for the reservoir simulation when running on larger heterogeneous HPC clusters that for an HPC grid. The present invention in effect forms a large computational pool or grid of heterogeneous processors for reservoir simulation and performs the simulation in an efficient way.

The computational pool or grid P (FIG. 2) is composed of multiple clusters, using different generation of processors, which are combined to create a grid with the large pool P of available processors. It should be understood that several techniques are available to connect the clusters. As an example, two clusters having different CPU types (FIG. 4A) are connected using a Qlogic Infiniband switch through free ports in large Qlogic cluster switches.

The present invention also provides an optimized load balancing methodology for Reservoir Simulation on the HPC grid or pool P. The computational task of reservoir simulation is mapped on a heterogeneous clusters or computational grid in such a way that a good load balance between CPU's is ensured. The mapping strategy according to the present invention also reduces communication overhead. The mapping strategy localizes the network traffic when CPU's are selected as much as possible by choosing neighboring nodes/CPU's and thus minimizes run time.

Hardware Performance Factor

The present invention provides for selection of a set of processors from the available pool of heterogeneous processors at any time and distribution of tasks weighted by a computer performance parameter. The computer performance parameter according to the present invention is a hardware performance factor (h).

The hardware performance factor (h) indicates relative efficiency of a processor to perform numerical operations of reservoir simulation model. Preferably, it is benchmarked performance which measures rate of floating point operations per second (FLOPs). As will be set forth, the hardware performance factors h for the different processor generations in the pool of processors are stored in a performance database D for use during allocation of processors according to the present invention.

Computational Load

Additionally, the computational load of a reservoir model is a function of number of cell blocks, the model type (black oil, fractured model, compositional, dual porosity dual permeability, locally refined grid and the like) and the methodology used to solve the problem. The computational load of reservoir simulation model can be expressed as R(N), which is a monotonic function of the number of cell blocks (N). Because of the presence of many factors in a reservoir simulation, R should be measured by benchmarking actual simulations with varying number of grid blocks (N). One can benchmark different class of problems with varying simulation parameters, such as phase in the simulation model, presence of fractures, etc., to obtain a correlation of R with those parameters. The computational load measure R once benchmarked for the types and complexities of reservoir simulation models is stored in a network effect database B for use during allocation of processors according to the present invention.

If such a correlation is not available, it can be postulated that R varies as O (n $\log_{10}$ n), where n is number of cell blocks on a processor. The choice of n $\log_{10}$ n as the controlling parameter for R results from the assumption that the solution time for n grid cells for an efficient solver should vary as n $\log_{10}$ n. If, however, the solution method takes O($n^2$) operations to solve the problem with size n, then R should be $n^2$ instead of n $\log_{10}$ n.

If computations are done on a homogeneous cluster of P processors, the simulation time should vary as $$T \cong R(N)/(hPd) \quad \text{Equation (1)}$$

where T is simulation time, h is hardware performance factor, P is number of processors used to solve the problem and d is domain decomposition efficiency factor compared to one dimensional decomposition (i.e., d=1 for one dimensional decomposition). If simulations are done on a heterogeneous cluster of two types of processors with hardware performance factors $h_1$ and $h_2$, the simulation time should vary as $$T \cong [R(N_1)/(h_1 P_1 d) + R(N-N_1)/(h_2 P_2 d)] \quad \text{Equation (2)}$$

where $N_1$ grid blocks are assigned to type 1 processors (total number $P_1$) and (N–$N_1$) grid blocks are assigned to type 2 processors (total number $P_2$).

Clearly, there is a slowdown if a grid which contains varying CPU types is used instead of a single high speed network to connect processors. The present provides methodology to avoid this type of slowdown. As an example, for a data processing system that has type 1 processors belonging to cluster 1 where processors are connected on a fast network, and type 2 processors belonging to cluster 2 where processors are connected by another fast network, and that the connection of cluster 1 and cluster 2 is over a grid which is slower that the fast intra-cluster networks by a factor, say $G_{1-2}$. Then Equation (2) becomes $$T \cong [R(N_1)/(h_1 P_1 d) + R(N-N_1)/(h_2 P_2 d)] * G_{1-2} \quad \text{Equation (3)}$$

For a grid with clusters with m different types of heterogeneous processors, Equation (3) may be generalized as:

$$T = [R(N_1)/(h_1 P_1 d) + R(N_2)/(h_2 P_2 d) + \ldots + R(N-N_1-N_2 \ldots -N_{m-1})/h_m P_m d] * G_{1-m} \quad \text{Equation (4)}$$

It is to be noted that if the domain decomposition strategy changes, (for example: from one dimensional to two dimensional), the value of d in Equation (3) or Equation (4) also changes.

Domain Decomposition of Reservoir

Different domain decomposition strategies give different levels of complexities and communication overhead. For example, one can consider a domain with an example reservoir grid block 40 units long and 50 units high, as shown in FIGS. 3A and 3B, which is decomposed using one and two dimensional blockings.

Considering the shaded sub-domain 32 in FIG. 3A with two dimensional blocking, the following measures are obtained: the area of sub-domain 32 (a measure of the number of grid blocks and thus computational load)=25*20=500; and the surface area adjacent to other sub domains 34 and 35 (measuring communication overhead)=25+20=45.

For the shaded sub-domain 36 in FIG. 3B with one dimensional blocking, the following measures are obtained: the area of sub-domain 36 (a measure of the number of grid blocks or computational load)=50*10=500; and the surface area adjacent to other sub domains 37 and 38 (a measure of communication overhead)=50+50=100.

It is noticeable that the amount of computation is same for both examples of blocks in FIGS. 3A and 3B, while communication overhead is more in one dimensional blocking than two dimensional blocking. This holds true for domain decomposition in general. Therefore, the methodology preferably decomposes the domain (reservoir) using two dimensional blocking where possible, unless it makes the inter-processor communication methodology very complex.

Hardware Performance Factor Weighted Domain Composition

According to the present invention, hardware performance factor weighted domain decomposition is performed. The objective of the hardware performance factor weighted domain decomposition is to obtain constant or nearly constant values of normalized load factor (L), as defined below:

$$L = h * R(N) \quad \text{Equation (5)}$$

FIG. 4A illustrates schematically an allocation of available processor nodes with domain decomposition based on hardware performance factor (h) according to the present invention. As indicated, there are four processors: Processor 1, Processor 2, Processor 3 and Processor 4. Two (Processors 1 and 2) have hardware performance factor $h_1$ and other two (Processors 3 and 4) have hardware performance factor $h_2$. Assignment of grid blocks to the allocated four processor nodes is such that the four processors have same value of normalized load factor, L. The total number of grid blocks in the model for the data processing system for reservoir simulation of FIG. 4A is N=2($N_1$+$N_2$).

FIG. 4A is thus is an example of domain decomposition based on hardware performance factor weighted domain decomposition. It can be seen that faster processors are given larger numbers of grid blocks (amount of computations based on R) to achieve load balance among processors. In other words, h*R (N) are equal for the four processors. There may be cases where it may be difficult to achieve an exactly equal value of L for all processors. The objective then is to obtain a substantially equal normalized load factor L, i.e., h*R(N), among processors.

FIG. 4B is a schematic illustration of two-dimensional hardware performance factor weighted domain decomposition according to the invention of a simulation run on a unified pool P with different generations of processor sub-clusters. In FIG. 4B, the most recent generation Gen 3 as indicated as G3 is faster than Gen 2 indicated as G2, which is in turn faster than Gen 1 indicated as G1. As indicated in FIG. 4B, the volumes of computational tasks are allocated according to the present invention among the three generations of processors G1, G2 and G3 so that the faster G3 processors are allocated larger volumes of data to process than the intermediate speed processors G2, which are in turn allocated larger volumes than the slower speed processors G1.

Processor Allocation

Figure 7:
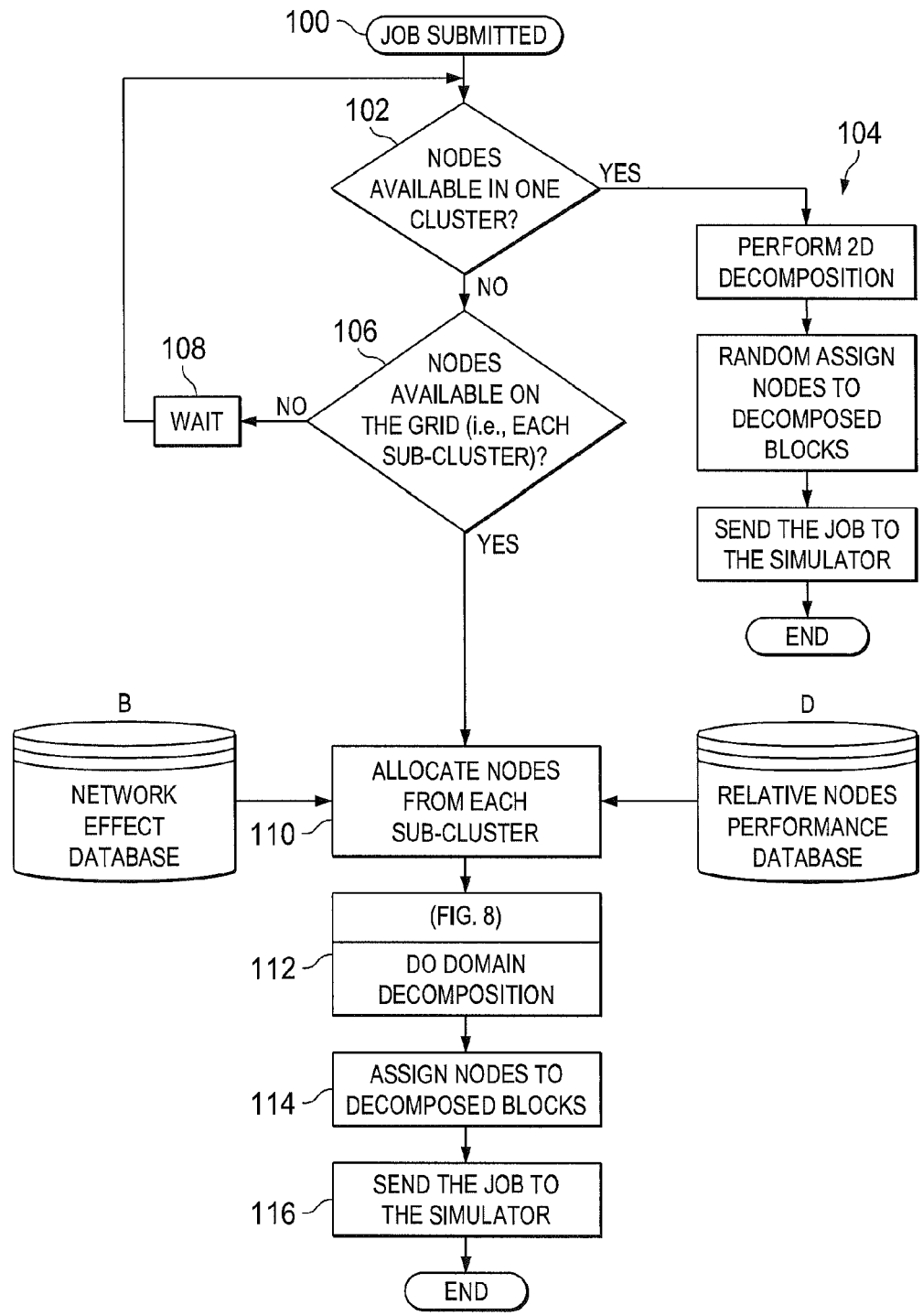
FIG. 7 is a functional block diagram of a set of computer processing steps performed in the data processing system of FIG. 2 for selection of processors for reservoir simulation with scalable grid computing according to the present invention.

FIG. 7 illustrates a set of processor steps performed in the pool P (FIG. 2) of processor sub-clusters. As indicated at step 100, the batch submission system reviews a user request for N latest (Gen X) processors, or those with the highest hardware performance factor h. The batch submission system compares as indicated at step 102 the number of the requested generation with the number of the requested generation which are available from any individual one of the sub-clusters in the available resource pool P. If during step 102 it is determined that the user requested number N of Gen X processors are available on a single sub-cluster to fulfill such user request, the user requested resources are assigned or made available. Processing transfers as indicated at 104 to conventional decomposition and random allocation of the simulation job data domains equally among the requested N processors in the single sub-cluster. Optimally two dimensional decomposition is preferably used, unless N is a prime number, i.e., N cannot be factored. In such a case, one dimensional decomposition is used.

If during step 102 it is instead determined that the user requested generation are not available from any individual one of the sub-clusters in the available resource pool P, the methodology of the present invention is performed. The present invention provides hardware performance factor weighted domain decomposition for computations on a set of heterogeneous processors from the pool P. The hardware performance factor weighted domain decomposition occurs if it is determined during step 102 that the number N of the user requested generation are not available from any individual one of the sub-clusters. As an example, if there are only M (where M<N) Gen X processors available, then hardware weighted domain decomposition according to the present invention is performed as illustrated in FIG. 7.

The heterogeneous pool of processors is examined during step 106 to determine if (N-M) fast processor equivalent resources are available in next best processor pool. In this determination, one fast processor equivalent node=h(x)/h(x−1)*Gen(X−1) processors, where h(x) is the h is hardware performance factor of Gen X processor, and h(x−1) is the hardware performance factor of Gen(X−1) processor. Hardware performance factors h for the various processor generations in the pool P are also used and obtained from the relative nodes performance database D. If during step 106 sufficient fast processor equivalent resources are not indicated as available, processing returns to step 106 for a specified waiting interval indicated at 108 and thereafter to step 104, where another inquiry is made as set forth above for step 104.

If during step 106 sufficient Gen (X−1) processors are determined to be available, an allocation of nodes from each processor in heterogeneous pool of the entire pool P is performed as indicated at step 110. In the allocation, estimates of simulation time given in Equation (3) or (4) above for the heterogeneous pool of processors are taken into account, as noted. Various parameters, including the impact of grid network bandwidth, are also considered. This evaluation is also done using the previously created database B of the measure R(N) obtained from benchmark studies various classes of reservoir simulation models for the same reservoir simulator. It is preferable that only relevant data of the same or similar class of reservoir simulation model as the requested user job be utilized for the evaluation.

During step 112 (expanded in FIG. 8), an optimal two dimensional decomposition is formulated using maximum number of processors from latest generation (Gen X), and some processors from the slower generation to compensate for the remaining required processing need. Because of this, two dimensional decomposition may use less than the needed M Gen X processors, even though they are available, by using other slower processors. As noted, the present invention uses the hardware performance factor weighted domain decomposition to obtain constant or nearly constant normalized load factors L, according to Equation (5).

The same generation of processors is used either in the row or columns direction of the domain (see FIG. 4A), while different generations of processors are used in the other direction of the domain.

During step 112, the best two dimensional decomposition found is evaluated versus best one dimensional decomposition (i.e., using M Gen X in combination with other generation of processors with equivalent of (N−M) Gen X processors compute power). This optimization workflow determines the best combination of processors and decomposition strategy.

During step 114, nodes which have been allocated during step 110 are assigned to the decomposed blocks resulting from step 112, resulting in different volumes of workload at the different generations of processor sub-clusters as described above, but with the constant or substantially normalized load factors L according to Equation (5).

After assigning nodes to decomposed blocks in step 114, a script then writes the best decomposition result in a special file to be used by the simulator.

During step 116, the processing job is sent to the simulator and the simulation performed. An example of a suitable simulator is the Saudi Aramco Parallel Oil Water Enhanced Reservoir Simulator (POWERS).

Figure 8:
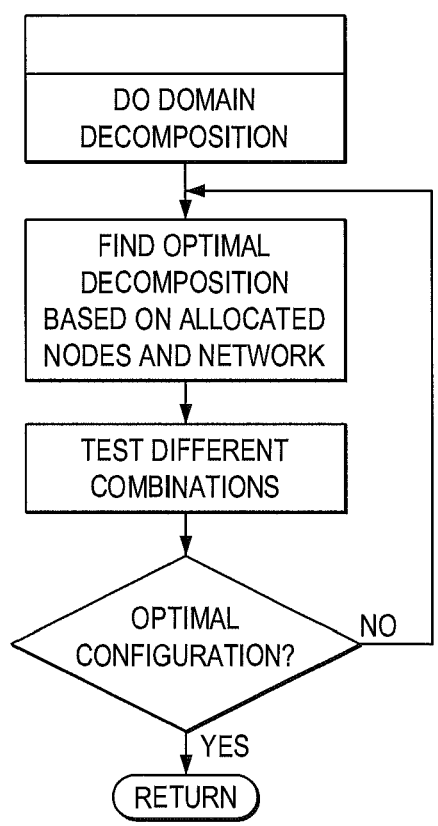
FIG. 8 presents an expanded sub-routine of the "Do Decomposition" process, which is a set of computer processing iterations performed in the data processing system of FIG. 2 for decomposition of the reservoir domain for reservoir simulation with scalable grid computing according to the present invention.

The methodology of FIG. 8 explains the domain decomposition routine iterations until the best combination is achieved.

For domain decomposition according to the present invention, it is preferable to use two dimensional domain decomposition, if possible, without making inter processor communications methodology complex. Otherwise one dimensional domain decomposition can be used. The batch script selects the pool based on the methodology of FIG. 7. The simulator decomposes the domain based on the selected of the pool of processors by the batch script.

The present invention unifies heterogeneous compute resources for the simulator using new domain decomposition strategy with good load balancing and the reduction of processor fragmentation across sub-clusters. A simulator, such as the Saudi Aramco Parallel Oil Water Enhanced Reservoir Simulator (POWERS), is adjusted to interact with the decomposition methodology of the present invention and optimally run on the underlying infrastructure to minimize its runtime.

A unified view of available compute power on the grid can be measured by Equation (6):

$$\begin{vmatrix} P_{11} & P_{21} & P_{31} \\ P_{12} & P_{22} & P_{32} \\ P_{13} & P_{23} & P_{33} \end{vmatrix} \times \begin{vmatrix} n_1 \\ n_2 \\ n_3 \end{vmatrix} = \begin{vmatrix} P_1 \\ P_2 \\ P_3 \end{vmatrix} \qquad \text{Equation (6)}$$

where $P_i$ is available power on the grid represented as a single unified CPU generation i; $P_{ij}$ is a CPU conversion factor from generation I to generation j (it is equivalent to hardware performance factor (h) described earlier); and $n_i$ is number of available processors of generation i (comes from the batch scheduler)

For example, for an available pool of three types of processors (generations), in which there are Gen3 (h=4) 413 nodes, Gen2 (h=3) 413 nodes, and Gen1 (h=1) 274 nodes, Equation (4) can be written for the three node generations is as follows:

$$T \cong R(N_1)/d \times \frac{1}{4} \times 413 + R(N_2)/d \times \frac{1}{3} \times 413 + R(N-N_1-N_2)/d \times 1/1 \times 274$$

$$\cong R(N_1)/d \times \frac{1}{4} \times 791$$

For one dimensional decomposition:

$$T \cong (R(N_1))/4 \times 791$$

and for two dimensional decomposition:

$$T \cong R(N_1)/d_2 \times \frac{1}{4} \times 791$$

and $d_2$ should be greater than 1.

Figure 6:
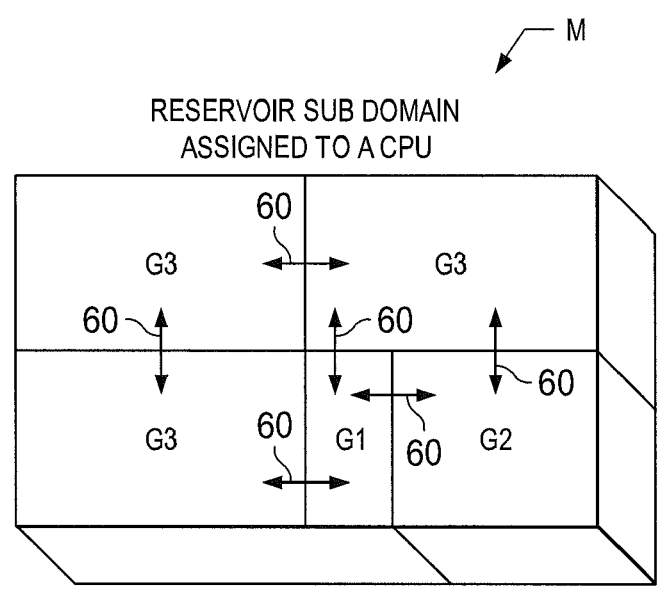
FIG. 6 is a schematic diagram of non-uniform two dimensional domain decomposition allocation of reservoir grid blocks between three generations of processors in a high performance computing grid.

Two dimensional decomposition is generally preferable over one dimensional decomposition, unless communication methodology becomes complex because on non-uniformity in decomposition. FIG. 6 is a schematic description of such decomposition. As illustrated, there is significant communication overhead between the subdomains assigned as indicated to the three generations G1, G2 and G3 of processors, as indicated by arrows 60 indicating two way data communication and consequent communication overhead.

From the foregoing, it can be understood that the methodology of the present invention optimizes run time by properly selecting a combination of various types of processors.

As illustrated in FIG. 9, a data processing system D according to the present invention includes a computer 150 having a processor 152 and memory 154 coupled to processor 152 to store operating instructions, control information and database records therein. The computer 150 may, if desired, be a portable digital processor, such as a personal computer in the form of a laptop computer, notebook computer or other suitable programmed or programmable digital data processing apparatus, such as a desktop computer. It should also be understood that the computer 150 may be a multicore processor with nodes such as those from Intel Corporation or Advanced Micro Devices (AMD), an HPC Linux cluster computer or a mainframe computer of any conventional type of suitable processing capacity such as those available from International Business Machines (IBM) of Armonk, N.Y. or other source.

The computer 150 has a user interface 156 and an output data or graphical user display 158 for displaying output data or records of lithological facies and reservoir attributes according to the present invention. The output display 158 includes components such as a printer and an output display screen capable of providing printed output information or visible displays in the form of graphs, data sheets, graphical images, data plots and the like as output records or images.

The user interface 156 of computer 150 also includes a suitable user input device or input/output control unit 160 to provide a user access to control or access information and database records and operate the computer 150. Data processing system D further includes a database 162 stored in computer memory, which may be internal memory 154, or an external, networked, or non-networked memory as indicated at 166 in an associated database server 168.

The data processing system D includes program code 170 stored in memory 154 of the computer 150. The program code 170, according to the present invention is in the form of non-transitory computer operable instructions causing the data processor 152 to perform the computer implemented method of the present invention in the manner described above.

It should be noted that program code 170 may be in the form of microcode, programs, routines, or symbolic computer operable languages that provide a specific set of ordered operations that control the functioning of the data processing system D and direct its operation. The instructions of program code 170 may be stored in non-transitory form in memory 154 of the computer 150, or on computer diskette, magnetic tape, conventional hard disk drive, electronic read-only memory, optical storage device, or other appropriate data storage device having a non-transitory computer usable medium stored thereon. Program code 170 may also be contained in non-transitory form on a data storage device such as server 168 as a computer readable medium.

The following example illustrates allocation by the jobs scheduler according to the present invention of processors and mapping (domain decomposition) of the reservoir to the grid architecture. In the example, a user requests a job with 791 processors. The hardware performance factor and expected run time for the job on various processors are shown in Table 1. Runtime for the job can be seen to vary from 1 to 4 hours on 791 processors for different generation of processors. The task of the batch scheduler script is to select a combination of processors from the available pool of processors which is expected to give similar run time as 791 Gen3 (i.e., fastest) processors.

The methodology of the present invention, which is performed as a part of the submission script for the reservoir simulation job, selects as requested for this example 791 Gen3 processors, if available. If 791 Gen3 processors are not available, the submission script may then instead choose a combination of processors, such as 274 Gen3 processors, 413 Gen2 processors and 413 Gen1 processors which should have similar performance as 791 Gen3 processors (i.e., run time 1 hour). The combination of processors from the available pool is not necessarily unique, the task of methodology in the submission script to search and find one if available. If no such combination of processors is found because of lack of availability of processors, the script provides the best combination of processors expected to give fastest run time of the job.

TABLE 1

Simulation of Various Hardware Generations

| Processor Type | Number of Processors | Hardware Performance Factor (h) | Runtime |
| --- | --- | --- | --- |
| Gen3 | 791 | 4 | 1.00 Hours |
| Gen2 | 791 | 3 | 2.00 Hours |
| Gen1 | 791 | 1 | 3.00 Hours |
| Combination (Gen3, Gen2 and Gen1) | 274 (Gen1), 413 (Gen2) and 413 (Gen1) | | 1.00 Hours |

The simulator decomposes the domain based on hardware performance factor, i.e., Gen3 processors will be assigned about 4 times more task as Gent processors and Gen2 processors will be assigned about 3 times more task than Gent processors to have nearly constant normalized load factor for all processors.

Table 2 below shows results from experimental runs.

| Case | Fast cluster | Slow cluster | Time (Minutes) |
|------|--------------|--------------|----------------|
| A    | 5            | 0            | 2.7            |
| B    | 0            | 5            | 4.4            |
| C    | 4            | 1            | 3.3            |
| D    | 2            | 3            | 4              |

If the clusters are cross-run and the decomposition technique performed according to the present invention (i.e. run on the grid), process time is an average of 4 minutes (Case D), compared to 4.4 minutes when running on natively slow cluster (Case B). In this way, advantage is taken and utilization made of the fragmented nodes (3 nodes from slow, 2 from fast) while providing a comparable performance to the stand alone higher speed sub-cluster.

Table 3 below shows another set of tests with further explanations:

| Case | Slow Cluster (cores) | Fast Cluster (cores) | Time (minutes) | Time (seconds) |
|------|----------------------|----------------------|----------------|----------------|
| A    | 8                    | 0                    | 22             | 3              |
| B    | 0                    | 8                    | 12             | 49             |
| C    | 4                    | 4                    | 23             | 0              |
| D    | 4                    | 4                    | 19             | 12             |
| E    | 8                    | 4                    | 15             | 24             |
| F    | 12                   | 4                    | 13             | 39             |
| G    | 16                   | 4                    | 12             | 30             |
| H    | 20                   | 4                    | 11             | 20             |

As demonstrated in Table 3, this example demonstrates decomposition methodology according to the present invention works and how it works on a grid to allocate processing between nodes. The reservoir simulation was run across a data processing system composed of 2×512 node clusters: a slow and a fast one. The difference in processor speed was such that if the slow cluster performance is X, the faster cluster is 4×. The reservoir simulated was a 2.2 MM cells model from the Shaybah field. As can be seen, the worst performance on the slow cluster alone (Case A) is 22 minutes and 3 seconds. The best performance on the fast cluster (Case B) is 12 minutes and 49 seconds. When the processing run is split equally across the slow and fast clusters (Case C), worse performance resulted than from the slow cluster alone (Case A) because of the network latency effect and the job runs by the slowest processor or CPU in the mix.

Applying the methodology of the present invention in decomposing the domain based on their respective hardware performance factors as described above, and using 4 cores on each cluster (Case D) for processing, the performance improvement is seen. Next, as indicated in Cases E through H, the number of slow cores is increased for the same domain decomposition, and performance times decrease until a performance equivalent to running the entire simulation on the fastest cluster alone is obtained.

The present invention provides the capability to physically expand the high performance computing (HPC) processing systems for reservoir simulation on an HPC grid. The present invention also provides a domain decomposition technique to achieve higher load balancing and computational efficiency. The expansion of the HPC infrastructure to grid computing is accompanied by adaptive detection of the available mix of resources. The reservoir simulation decomposition methodology in effect adaptively learns about the underlying hardware and different processor generations, and adjusts the distribution of load based on these resources to minimize the processing runtime for the simulator. Accordingly, the present invention provides the ability to efficiently run larger Reservoir Simulation models on heterogeneous High Performance Computing grids. In contrast, conventional methods where domain decompositions were used in simulation were suited for only homogenous set of processors in the cluster.

It can thus be seen that the present invention provides a scalable and expandable HPC environment for reservoir simulation, and in particular large-scale reservoir simulation in what are known as giant reservoirs. The present invention overcomes processing slowness encountered in HPC computing with a mixture of older and newer generations of sub-clusters resulting in significant cost savings and upgrades the processing speed to that of the fastest generation of processors. The present invention permits increased utilization for older generations of computers with slower processors.

Simulation models are developed to predict field production performance. They are used to develop strategic surveillance plans for fields and to evaluate sweep efficiency and optimize recovery. Users can use old and new compute resources simultaneously with no slowdown of the simulation process. This provides for running extremely large models that also were not, so far as is known, available before. Another major benefit is to ensure long-term integrity of reservoirs and providing dynamic assessment of reserves to maximize ultimate recovery.

The invention has been sufficiently described so that a person with average knowledge in the matter may reproduce and obtain the results mentioned in the invention herein Nonetheless, any skilled person in the field of technique, subject of the invention herein, may carry out modifications not described in the request herein, to apply these modifications to a determined computer system, or in the implementation of the methodology, requires the claimed matter in the following claims; such structures shall be covered within the scope of the invention.

It should be noted and understood that there can be improvements and modifications made of the present invention described in detail above without departing from the spirit or scope of the invention as set forth in the accompanying claims.

What is claimed is:

1. A computer implemented method of reservoir simulation in a data processing system, the data processing system comprising a unified pool of a plurality of processor clusters of processor nodes, at least one of the processor clusters of the unified pool being composed of processor nodes having a different processing speed than the processing speed of processor nodes in other processor clusters of the unified pool, the computer implemented method comprising the steps of:
    (a) reviewing a request for reservoir simulation with processors of an identified processing speed;
    (b) determining whether one of the processor clusters of the unified pool has processor nodes of the identified processing speed available for the requested reservoir simulation;

(c) if so, performing the requested reservoir simulation in the determined processor cluster by performing the steps of:
   (1) performing a domain decomposition of reservoir data into blocks for the reservoir simulation;
   (2) assigning the processor nodes of the determined processor cluster to individual ones of the decomposed reservoir data blocks; and
   (3) performing the requested reservoir simulation in the assigned processor nodes of the determined processor cluster; and
(d) if not, performing the requested reservoir simulation with the processor nodes of each of the plurality of processor clusters in the unified pool by performing the steps of:
   (1) allocating available processor nodes from each of the plurality of processor clusters of the unified pool, at least one of the plurality of processor clusters having processor nodes of different processing speed than the processing speed of the processor nodes of the other processor clusters;
   (2) performing a domain decomposition of reservoir data into blocks for the reservoir simulation by the allocated processor nodes from each of the plurality of processor clusters of the unified pool;
   (3) assigning the allocated processor nodes of different operating speed allocated from each of the plurality of processor clusters of different processing speed into processor sub-clusters for individual ones of the decomposed reservoir data blocks; and
   (4) performing the requested reservoir simulation in the assigned processor sub-clusters of the assigned allocated processor nodes.

2. The computer implemented method of claim 1, further including the step of:
   forming a computational load measure based on the type of reservoir simulation to be requested.

3. The computer implemented method of claim 1, further including the step of:
   forming a measure of performance of the processor nodes in the different processor clusters.

4. The computer implemented method of claim 1, wherein the step of allocating available processor nodes from the processor clusters of different processing speeds includes the steps of:
   forming a postulated grouping of available processor nodes from the plurality of processor clusters of different processing speeds for performing the reservoir simulation;
   forming a measure of processing time for the postulated grouping of available processor nodes; and
   determining from the formed measure of processing time whether an optimum grouping of processor nodes is present.

5. The computer implemented method of claim 4 wherein the step of determining indicates an optimum grouping is not present, and further including the step of:
   returning to the step of forming a postulated grouping to form another postulated grouping of available processor nodes.

6. The computer implemented method of claim 5, wherein the step of determining indicates an optimum grouping is present, prior to the step of assigning the allocated processor nodes.

7. A data processing system comprising a unified pool of a plurality of processor clusters of processor nodes performing reservoir simulation, at least one of the processor clusters of the unified pool being composed of processor nodes having a different processing speed than the processing speed of processor nodes in other processor clusters of the unified pool, the processor nodes in the data processing system performing the steps of:
   (a) reviewing a request for reservoir simulation with processors of an identified processing speed;
   (b) determining whether one of the processor clusters of the unified pool has processor nodes of the identified processing speed available for the requested reservoir simulation;
   (c) if so, performing the requested reservoir simulation in the determined processor cluster by performing the steps of:
      (1) performing a domain decomposition of reservoir data into blocks for the reservoir simulation by the one processor cluster;
      (2) assigning the processor nodes of the determined processor cluster to individual ones of the decomposed reservoir data blocks; and
      (3) performing the requested reservoir simulation in the assigned processor nodes of the determined processor cluster; and
   (d) if not, performing the requested reservoir simulation with the processor nodes of each of the plurality of processor clusters in the unified pool by performing the steps of:
      (1) allocating available processor nodes from each of the plurality of processor clusters of the unified pool, at least one of the plurality of processor clusters having processor nodes of different processing speed than the processing speed of the processor nodes of the other processor clusters;
      (2) performing a domain decomposition of reservoir data into blocks for the reservoir simulation by the allocated processor nodes from each of the plurality of processor clusters of the unified pool;
      (3) assigning the allocated processor nodes of different operating speed allocated from each of the plurality of processor clusters of different operating speed into processor sub-clusters for individual ones of the decomposed reservoir data blocks; and
      (4) performing the requested reservoir simulation in the assigned processor sub-clusters of the assigned allocated processor.

8. The data processing system of claim 7, wherein the processors further perform the step of:
   forming a computational load measure based on the type of reservoir simulation to be requested.

9. The data processing system of claim 7, wherein the processors further perform the step of:
   forming a measure of performance of the processor nodes in the different processor clusters.

10. The data processing system of claim 7, wherein the plurality of processor nodes of the plurality of processor clusters in allocating available processor nodes further perform the steps of:
   forming a postulated grouping of available processor nodes from the processor clusters of different processing speeds for performing the reservoir simulation;
   forming a measure of processing time for the postulated grouping of available processor nodes; and
   determining from the formed measure of processing time whether an optimum grouping of processor nodes is present.

11. The data processing system of claim 7, wherein the processors in determining whether an optimum grouping is present indicate an optimum grouping is not present, and the processors further perform the step of:

returning to the step of forming a postulated grouping to form another postulated grouping of available processor nodes.

12. The data processing system of claim 7, wherein the processors in determining whether an optimum grouping is present indicate an optimum grouping is present, and the processors then perform the step of comparing prior to assigning the allocated processor nodes.

13. A data storage device having stored in a computer readable medium non-transitory computer operable instructions for reservoir simulation in a data processing system, the data processing system comprising a unified pool of a plurality of processor clusters of processor nodes, at least one of the processor clusters of the unified pool being composed of processor nodes having a different processing speeds' than the processing speed of processor nodes in other processor clusters of the unified pool, the instructions stored in the data storage device causing the data processing system to perform the following steps:

(a) reviewing a request for reservoir simulation with processors of an identified processing speed;

(b) determining whether one of the processor clusters of the unified pool has processor nodes of the identified processing speed available for the requested reservoir simulation;

(c) if so, performing the requested reservoir simulation in the determined processor cluster by performing the steps of:

(1) performing a domain decomposition of reservoir data into blocks for the reservoir simulation;

(2) assigning the processor nodes of the determined processor cluster to individual ones of the decomposed reservoir data blocks; and (3) performing the requested reservoir simulation in the allocated processor nodes of the determined processor cluster; and (d) if not, performing the requested reservoir simulation with the processor nodes of each of the plurality of processor clusters in the unified pool by performing the steps of:

(1) allocating available processor nodes from each of the plurality of processor clusters of the unified pool, at least one of the plurality of processor clusters having processor nodes of different processing speed than the processing speed of the processor nodes of the processor clusters;

(2) performing a domain decomposition of reservoir data into blocks for the reservoir simulation by the allocated processor nodes from each of the plurality of processor clusters of the unified pool;

(3) assigning the allocated processor nodes of different operating speed allocated from each of the plurality of processor clusters of different processing speeds into processor sub-clusters for individual ones of the decomposed reservoir data blocks; and (4) performing the requested reservoir simulation in the assigned processor sub-clusters of the assigned allocated processor nodes.

14. The data storage device of claim 13, wherein the instructions includes causing the data processing system to perform the step of:

forming a computational load measure based on the type of reservoir simulation to be requested.

15. The data storage device of claim 13, wherein the instructions includes causing the data processing system to perform the step of:

forming a measure of performance of the processor nodes in the different processor clusters.

16. The data storage device of claim 13, wherein the instructions for allocating available processor nodes from the processor clusters of different processing speeds include instructions causing the data processing system to perform the steps of:

forming a postulated grouping of available processor nodes from the processor clusters of different processing speeds for performing the reservoir simulation;

forming a measure of processing time for the postulated grouping of available processor nodes; and determining from the formed measure of processing time whether an optimum grouping of processor nodes is present.

17. The data storage device of claim 13 wherein the step of determining indicates an optimum grouping is not present, and the instructions include instructions causing the data processing system to perform the step of:

returning to the step of forming a postulated grouping to form another postulated grouping of available processor nodes.

18. The data storage device of claim 13 wherein the step of determining indicates an optimum grouping is present and the instructions include instructions causing the data processing system to then perform the step of assigning the allocated processor nodes.

19. The computer implemented method of claim 1, further including the steps of:

forming a computational load measure based on the type of reservoir simulation to be requested;

storing the formed computational load measure in a network effect database of the computer;

forming a measure of performance of the processor nodes in the different processor clusters;

storing the formed measure of performance of the processor nodes in a network effect database of the computer; and wherein the step of allocating available processor nodes from the processor nodes of different processing speeds is performed based on the computational load measure and the formed measure of performance of the processor nodes.

20. The computer implemented method of claim 2, further including the step of:

storing the formed computational load measure in a network effect database of the computer.

21. The computer implemented method of claim 3, further including the step of:

storing the formed measure of performance of the processor nodes in a network effect database of the computer.

22. The data processing system of claim 7, wherein the processors further perform the step of:

forming a computational load measure based on the type of reservoir simulation to be requested;

storing the formed computational load measure in a network effect database of the computer;

forming a measure of performance of the processor nodes in the different processor clusters;

storing the formed measure of performance of the processor nodes in a network effect database of the computer; and wherein the step of allocating available processor nodes from the processor nodes of different processing speeds is performed based on the computational load measure and the formed measure of performance of the processor nodes.

23. The data processing system of claim 8, wherein the processors further perform the step of:
   storing the formed computational load measure in a network effect database of the computer.

24. The data processing system of claim 9, wherein the processors further perform the step of:
   storing the formed measure of performance of the processor nodes in a network effect database of the computer.

25. The data storage device of claim 13, wherein the instructions include instructions causing the data processing system to perform the steps of:
   forming a computational load measure based on the type of reservoir simulation to be requested;
   storing the formed computational load measure in a network effect database of the computer;
   forming a measure of performance of the processor nodes in the different processor clusters;
   storing the formed measure of performance of the processor nodes in a network effect database of the computer; and
   wherein the step of allocating available processor nodes from the processor nodes of different processing speeds is performed based on the computational load measure and the formed measure of performance of the processor nodes.

26. The data storage device of claim 14, wherein the instructions include instructions causing the data processing system to perform the step of:
   storing the formed computational load measure in a network effect database of the computer.

27. The data storage device of claim 15, wherein the instructions include instructions causing the data processing system to perform the step of:
   storing the formed measure of performance of the processor nodes in a network effect database of the computer.

28. The computer implemented method of claim 1, wherein the step of assigning the allocated processor nodes of the processor clusters to individual ones of the decomposed reservoir data blocks during performing the requested reservoir simulation comprises the step of:
   assigning individual ones of the decomposed reservoir data blocks to selected ones of the allocated processor nodes of the different processing speeds in the plurality of processor clusters in the pool.

29. The data processing system of claim 7, wherein the processor in assigning the allocated processor nodes of the processor clusters to individual ones of the decomposed reservoir data blocks during performing the requested reservoir simulation performs the step of:
   assigning individual ones of the decomposed reservoir data blocks to selected ones of the allocated processor nodes of the different processing speeds in the plurality of processor clusters in the pool.

30. The data storage device of claim 13, wherein the instructions causing the data processing system to assign the allocated processor nodes of the processor clusters to individual ones of the decomposed reservoir data blocks during performing the requested reservoir simulation further comprise instructions to perform the step of:
   assigning individual ones of the decomposed reservoir data blocks to selected ones of the allocated processor nodes of the different processing speeds in the plurality of processor clusters in the pool.

* * * * *